(12) United States Patent
May

(10) Patent No.: US 6,778,119 B2
(45) Date of Patent: Aug. 17, 2004

(54) METHOD AND APPARATUS FOR ACCURATE DIGITAL-TO-ANALOG CONVERSION

(75) Inventor: Marcus W. May, Austin, TX (US)

(73) Assignee: Sigmatel, Inc., Austin, TX (US)

( * ) Notice: Subject to any disclaimer, the term of this patent is extended or adjusted under 35 U.S.C. 154(b) by 0 days.

(21) Appl. No.: 10/603,544

(22) Filed: Jun. 25, 2003

(65) Prior Publication Data

US 2004/0104830 A1 Jun. 3, 2004

Related U.S. Application Data

(60) Provisional application No. 60/429,941, filed on Nov. 29, 2002.

(51) Int. Cl.$^7$ ................................................ H03M 1/66
(52) U.S. Cl. ........................................ 341/144; 341/113
(58) Field of Search ................................ 341/144, 161, 341/93, 67, 88, 113

(56) References Cited

U.S. PATENT DOCUMENTS

| | | | | |
|---|---|---|---|---|
| 3,857,021 A | * | 12/1974 | Wilensky et al. | 708/7 |
| 5,028,926 A | * | 7/1991 | Tokuhiro | 341/161 |
| 5,148,161 A | * | 9/1992 | Sako et al. | 341/93 |
| 5,870,049 A | * | 2/1999 | Huang et al. | 341/144 |
| 5,995,031 A | * | 11/1999 | Okuda et al. | 341/144 |
| 6,414,618 B2 | * | 7/2002 | Bult et al. | 341/144 |
| 6,448,917 B1 | * | 9/2002 | Leung et al. | 341/144 |
| 6,549,154 B2 | * | 4/2003 | Isobe et al. | 341/144 |
| 6,549,156 B1 | * | 4/2003 | Moser | 341/144 |
| 6,593,868 B2 | * | 7/2003 | Clara et al. | 341/144 |
| 6,639,534 B2 | * | 10/2003 | Khoini-Poorfard et al. | 341/144 |

* cited by examiner

Primary Examiner—Jean Bruner Jeanglaude
(74) Attorney, Agent, or Firm—Timothy W. Markison

(57) ABSTRACT

A digital-to-analog converter includes a plurality of current sources, a differential amplifier, and a plurality of switching modules. The plurality of switching modules is operably coupled to the plurality of current sources and the digital amplifier module provides the analog output for the digital-to-analog converter. Each of the plurality of switching modules has a corresponding current source of the plurality of current sources, where a $1^{st}$ set of the plurality of switching modules couples the corresponding current sources to the differential amplifier module in a $1^{st}$ manner based on a digital input value and a $2^{nd}$ set of the plurality of switching modules couples the corresponding current sources to the differential amplifier in a $2^{nd}$ manner based on the digital input values such that, over time, errors introduced by the coupling in the $1^{st}$ manner substantially compensates for errors introduced by the coupling in the $2^{nd}$ manner.

18 Claims, 8 Drawing Sheets cell of a prior art DAC timing diagram for Figure 1 integrated circuit 12 integrated circuit 12-1

DAC 72

DAC 72

DAC 72 portion of conversion control circuit 182

METHOD AND APPARATUS FOR ACCURATE DIGITAL-TO-ANALOG CONVERSION

This patent is claiming priority under 35 USC § 119(e) to provisionally filed patent application entitled MULTI-FUNCTION HANDHELD DEVICE, having a provisional Ser. No. of 60/429,941 and a provisional filing date of Nov. 29, 2002.

BACKGROUND OF THE INVENTION

1. Technical Field of the Invention

This invention relates generally to mix signal processing and more particularly to digital-to-analog conversion.

2. Description of Related Art

Digital-to-analog converters are known to be used in a wide variety of mix signal (i.e., analog and digital signaling) applications. For example, digital-to-analog converters are used in all digital audio equipment to convert digital audio data into analog audio signals, which can be rendered audible via a speaker. Further, digital-to-analog converters are used in video equipment to convert digitized video signals into analog video signals that may be subsequently rendered visible on a CRT (cathode ray tube) display.

As is also known, current mode digital-to-analog converters are quite popular due to their ease of implementation using CMOS integrated circuit technology. A current mode digital-to-analog converter includes a plurality of equal valued current sources, gating circuitry, and a differential amplifier. The gating circuitry includes a plurality of cascaded flip-flops and transistors, where the flip-flops serially receive a digital input and, on a cycle-by-cycle basis, produce a collective output that gates the transistors, which, in turn, enables the current sources to drive either the inverting or non-inverting input of the differential amplifier. The differential amplifier includes a feedback network to establish an analog output voltage based on the cycle-by-cycle current sourcing of the inverting and non-inverting inputs. As such, the analog output is computed based on a 1's density of the digital input (i.e., the number of logic is currently contained in the gating circuitry). Accordingly, the more 1s in the current digital input, the greater the analog output and, conversely, the less 1s in the current digital input, the lower the analog output.

For example, a current mode digital-to-analog converter that includes four equally valued current sources can convert a current 4-bit digital input value into one of five analog output states. The lowest of the five analog output states is achieved when the four current bits of the digital input are all 0s (e.g., 0000). The next lowest analog output state is achieved when one of the four current bits is 1 and the remaining bits are 0s (e.g., 1000, 0100, 0010, or 0001). The middle level analog output is achieved when two of the four current bits are 1s and the other two bits are 0s (e.g., 1100, 1010, 1001, 0011, 0101, 0110). The second highest state of the analog output is achieved when three of the four bits are 1s and the remaining bit is a 0 (e.g., 0111, 1110, 1011, 1101). The highest of the five analog output states is achieved when the four current bits of the digital input are all 1s (e.g., 1111). Accordingly, the greater number of current sources, the more granular the analog output.

While current mode DACs are popular due their ease of implementation using CMOS technology, they have certain limitations and/or drawbacks. For example, the flip-flops and transistors of the gating circuitry do not produce inversely identical signals. Accordingly, the current provided to the inverting and non-inverting inputs of the differential amplifier are not inversely identical signals. This imbalance, if not corrected, causes a distortion of the digital to analog conversion process and illustrated in FIGS. 1 and 2.

FIG. 1 is a schematic block diagram of a cell of the gating circuit of a prior art current mode digital-to-analog converter. The cell includes 2N-channel transistors and a D flip-flop, where the transistors are coupled to one of the current sources. The D flip-flop is clocked based on the rate of the incoming digital input and receives one bit of the digital input ($b_n$) from a preceding cell in the gating circuitry or, if the cell is the first cell in the gating circuitry, receives the one bit of the digital input from a digital source. Thus, at the clocking of the D flip-flop, if the input bit is a logic 1, the Q output is high and the Q bar output is low producing a current (I), which would be provided to the inverting input of the differential amplifier. If, however, the input is a logic 0, and Q output is low and the Q bar output is high producing at I bar current, which is provided to the non-inverting input of the differential amplifier. While the N-channel transistors are generally matched, the drive circuitry of the D flip-flop and the imperfections of the transistors yields different rise and fall times for generation of I and I bar.

FIG. 2 illustrates a timing diagram for the cell of the prior art digital-to-analog converter of FIG. 1. The diagram includes a clock signal, the bit input, the Q output, the Q bar output, the current I output and the current I bar output. The D flip-flop is rising edge triggered such that at every rising edge of the clock signal, the value of the input bit of the D flip-flop is latched into the Q output of the flip-flop. As shown, at the first rising edge of the clock, the digital input is a logic 1 thus, causing the Q output to rise to a logic 1 and the Q bar output to fall to a logic 0. As shown, however, the rise time is faster than the fall time. Conversely, the fall time may occur faster than the rise time. In this illustration, with the rise time being faster than the fall time, the resulting currents are imbalanced since the non-inverting current (I) rises faster than the inverted current (I bar) falls.

To overcome this imbalance of rise and fall times, current mode DACs utilize return-to-zero (RTZ) circuitry. As is known, RTZ circuitry forces the outputs of each cell of the gating to be set to zero before a next bit is processed. By staring each new cycle at zero, the adverse effects of the imbalanced rise and fall times are substantially overcome.

While RTZ circuitry substantially overcomes the adverse effects of imbalanced rise and fall times, it requires time to set the outputs to the zero state. As the bit rates increase for DACs, the RTZ processing time is consuming a greater percentage of the clock cycle, thereby reducing the time for the digital to analog conversion. At and above certain data rates, the RTZ processing time is too great, thus rendering this solution to the imbalanced rise and fall time problem unusable. Further, RTZ circuitry consumes power to perform it function, which, for battery-operated devices, reduces battery life.

Therefore, a need exists for a method and apparatus that reduces the current imbalances within digital-to-analog converters without an RTZ circuit and/or reduces power consumption.

BRIEF SUMMARY OF THE INVENTION

The accurate digital-to-analog conversion of the present invention substantially meets these needs and others. In one embodiment, a digital-to-analog converter includes a differential amplifier, a plurality of current sources, and a conversion control circuitry. The differential amplifier includes a non-inverting input, an inverting input, a non-inverting output, an inverting output, and a gain network coupled to the inputs and outputs. The conversion control circuitry operably couples a 1st set of the plurality of current sources to the inverting input or to the non-inverting input of the differential amplifier in accordance with a 1st set of bits of a digital input and couples, via at least one inversion, a $2^{nd}$ set of the plurality of current sources to the inverting or non-inverting input of the differential amplifier based on a $2^{nd}$ set of bits of the digital input. For example, the conversion control circuitry couples half of the current sources to the differential amplifier in one manner and the other half of the current sources to the differential amplifier in a second manner to substantially eliminate the adverse effects caused by imbalances in rise and falls times without the use of an RTZ circuit, which has the further benefit of reduced power consumption and smaller die area.

DETAILED DESCRIPTION OF THE INVENTION

Figure 1:
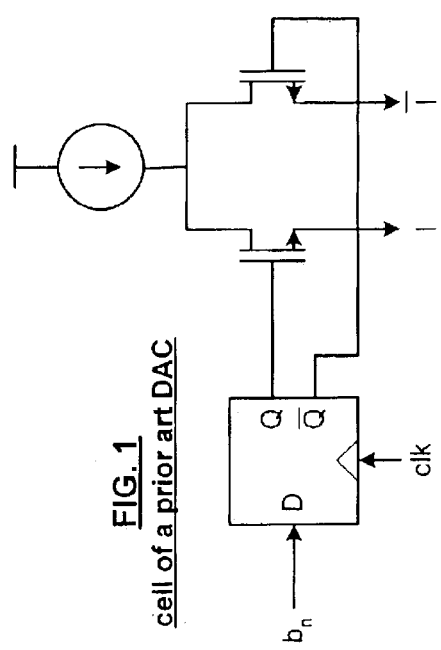
FIG. 1 is a schematic block diagram of a cell of a prior art digital-to-analog converter.
Figure 2:
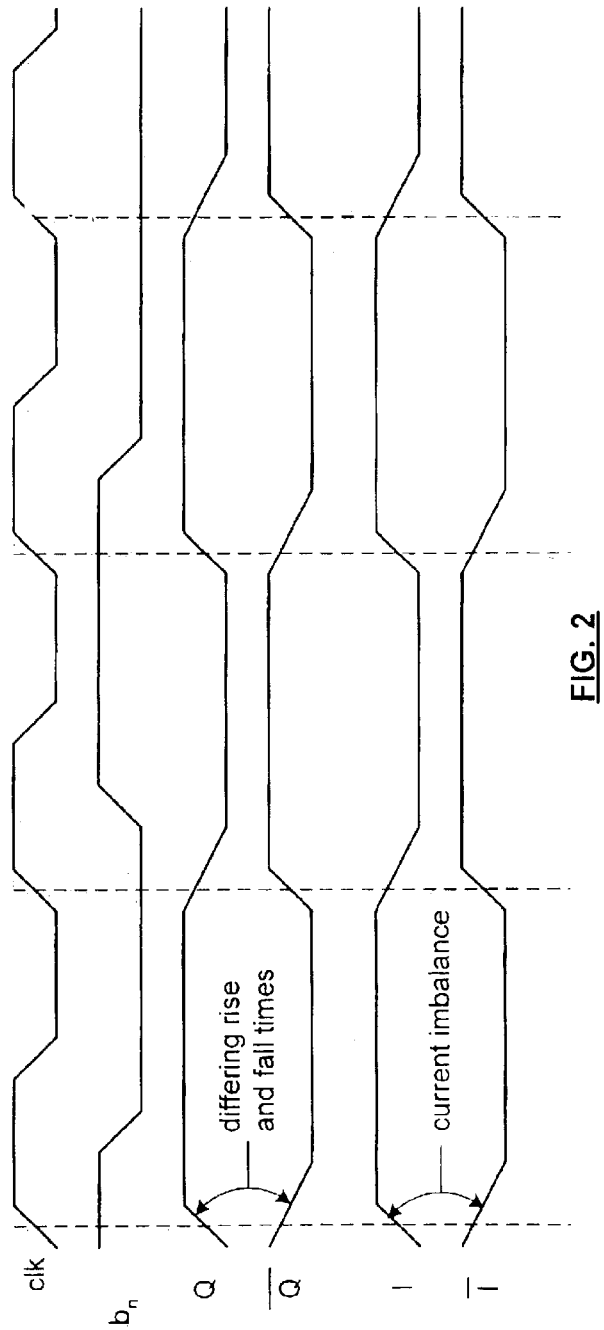
FIG. 2 is a timing diagram of operation of the cell of the prior art digital-to-analog converter of FIG. 1.
Figure 3:
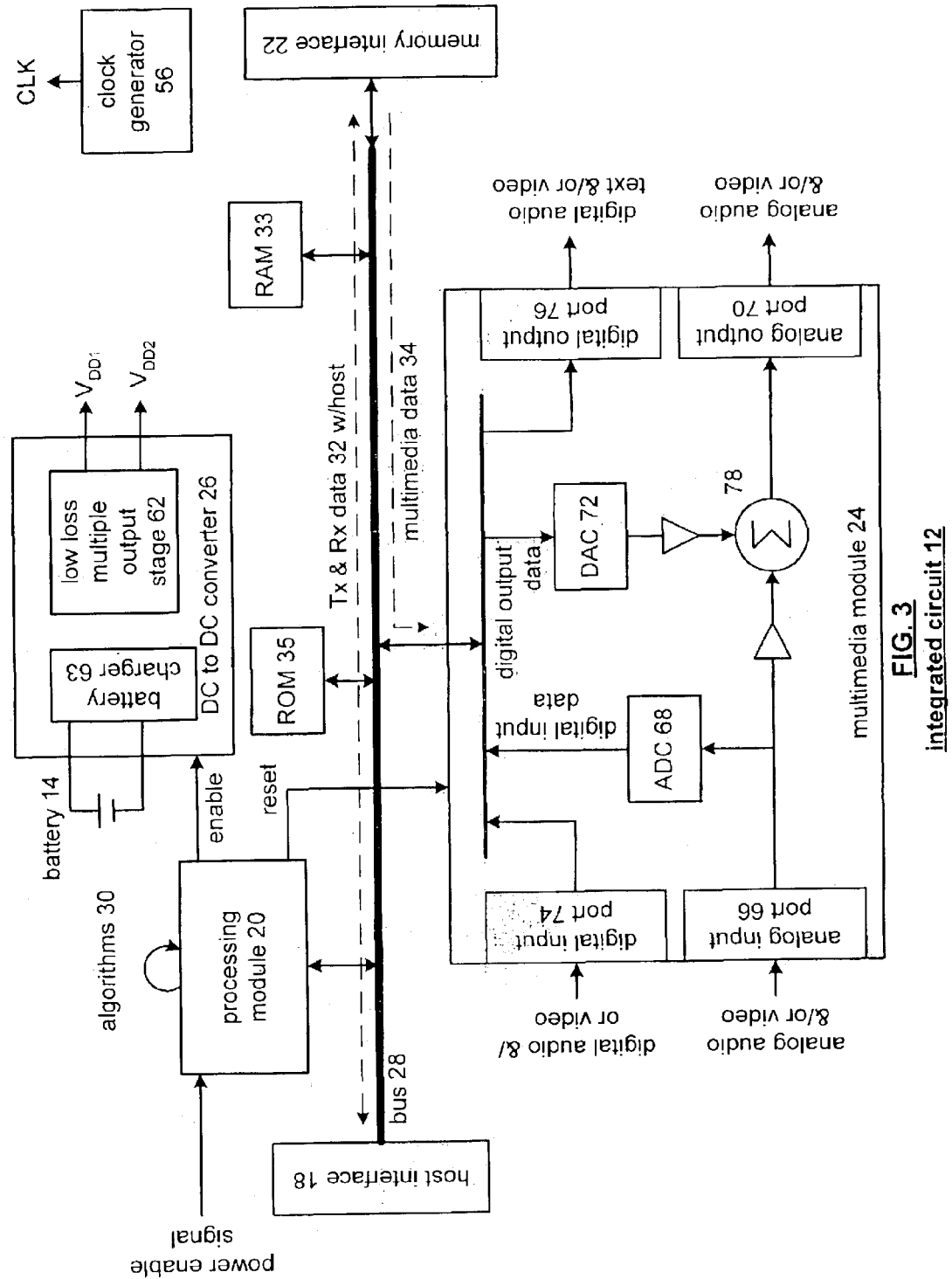
FIG. 3 is a schematic block diagram of an integrated circuit in accordance with the present invention.

FIG. 3 is a schematic block diagram of an integrated circuit 12-2 that may be used in a multi-function handheld device. The integrated circuit 12-2 includes the host interface 18, the processing module 20, the DC-to-DC converter 26, memory 60, the clock generator 56, the memory interface 22, the bus 28 and the multimedia module 24. The DC-to-DC converter 26 includes a first output section 62, and a second output section 64 to produce a first and second output voltage ($V_{DD1}$ and $V_{DD2}$), respectively. Typically, $V_{DD1}$ will be greater that $V_{DD2}$, where $V_{DD1}$ is used to source analog sections of the processing module 20, the host interface 18, the memory interface 22, and/or the multimedia module 22 and $V_{DD2}$ is used to source the digital sections of these modules. The DC-to-DC converter 26 may further include a battery charger 63 and a low loss multiple output stage 62. The battery charger 63 is operable to charge the battery 14 from power it receives via the physical coupling (e.g., via a USB cable) to the hose device when the multi-function handheld device is physically coupled to the host device. The particular implementation of the battery charger 63 is dependent on the type of battery being used and such implementations are known in the art, thus not further discussion will be provided regarding the battery charger 63 except to further illustrate the concepts of the present invention.

The multimedia module 24 includes an analog input port 66, an analog to digital converter (ADC) 68, an analog output port 70, a digital to analog converter (DAC) 72; a digital input port 74, a digital output port 76, and an analog mixing module 78. The analog input port 66 is operably coupled to receive analog input signals from one or more sources including a microphone, an AM/FM tuner, a line in connection (e.g., headphone jack of a CD player), etc. The received analog signals are provided to the ADC 68, which produces digital input data therefrom. The digital input data may be in a pulse code modulated (PCM) format and stored as such, or it may be provided to the processing module 20 for further audio processing (e.g., compression MP3 formatting, etc.) The digital input data, or the processed version thereof, is stored in memory 16 as instructed by the processing module 20.

The digital input port 74 is operably coupled to receive digital audio and/or video input signals from, for example, a digital camera, a camcorder, etc. The digital audio and/or video input signals may be stored in memory 16 under the control of the processing module 20. As one of average skill in the art will appreciate, the audio and/or video data (which was inputted as analog signals or digital signals) may be stored as raw data (i.e., the signals received are stored as is in designated memory locations) or it may be stored as processed data (i.e. compressed data, MPEG data, MP3 data, WMA data, etc.).

The DAC 72 receives multimedia data 34 as digital output data and converts it into analog video and/or audio output data that is provided to the mixing module 78. When the output of the DAC 72 is the only input to the mixing module 78, the mixing module 78 outputs the analog video and/or audio output data to the analog output port 70. The analog output port 70 may be coupled to one or more of the speaker, headphone jack, and a video display. The mixing module 78 may mix input signals received via the analog input port 66 with the output of DAC 72 to produce a mixed analog signal that is provided to the analog output port 70. Note that the buffers in series with the inputs of the mixing module 78 may have their gains adjusted and/or muted to enable selection of the signals at various gain settings provided to the mixing module 78 and subsequently outputted via the analog output port 70.

The digital output port 76 is operably coupled to output the digital output data (i.e., the multimedia data 34 in a digital format). The digital output port 76 may be coupled to a digital input of a video display device, another handheld device for direct file transfer, etc.

As one of average skill in the art will appreciate, the multimedia module 24 may include more or less components that the components shown in FIG. 3 or include multiple analog and/or digital input and/or output ports. For example, for a playback mode of digital audio files, the multimedia module 24 may only include the DAC 72 and the analog output port 70 that is coupled to the headphone jack and/or to the speaker. As another example, for recording voice samples (i.e., as a digital dictaphone), the multimedia module 24 may include the analog input port 66 coupled to the microphone and the ADC.

Figure 4:
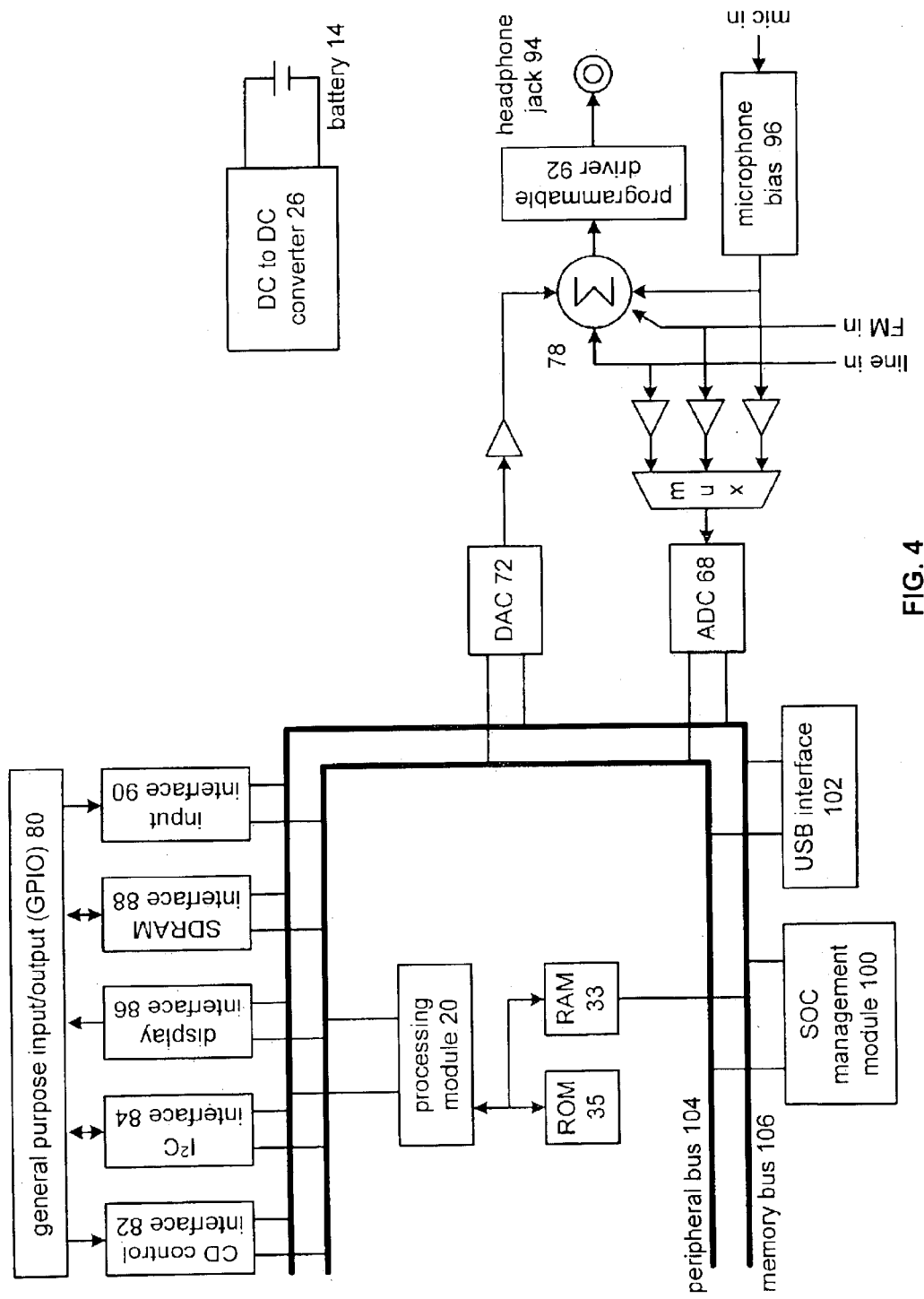
FIG. 4 is a schematic block diagram of an alternate integrated circuit in accordance with the present invention.

FIG. 4 is a schematic block diagram of an integrated circuit 12-3 that may be incorporated in a multi-function handheld device 10 or 40. The integrated circuit 12-3 includes a general purpose input/output module 80, a CD control interface 82, an I$^2$C interface module 84, a display interface module 86, a static and/or dynamic RAM interface 88, an input interface module 90, processing module 20, ROM 35, RAM 33, a peripheral bus 104, a memory bus 106, a system-on-a-chip (SOC) management module 100, a universal serial bus (USB) interface 102, a digital-to-analog converter 72, an analog-to-digital converter 68, a multiplexer, buffers, mixing module 78, DC to DC converter 26, a programmable driver 92, and a microphone bias module 96.

In operation, the integrated circuit 12-3 may facilitate the transceiving of data with a host device between system memory of a multi-function handheld device and a host device, may playback multimedia data, and/or may record multimedia data via input ports. When the integrated circuit 12-3 is transceiving with host a device, the USB interface 102 operably couples the integrated circuit 12-3 to a host device. In addition, the SDRAM interface 88 couples, either via the general purpose input/output module 80 or directly, to the system memory (e.g., memory IC 16) of the multi-function handheld device 10. In this configuration, data that is received from the host device is placed on the memory bus 106 by the USB interface 102. The SDRAM interface 88 retrieves the data from the memory bus 106 and forwards it for storage to the system memory under the control of the processing module 20 that is executing a file system storage algorithm. The data being stored may correspond to playback data, such as an MP3 file, a WMA file, a video file, a text file, and/or a combination thereof. Alternatively, or in addition to, the data being received from the host may correspond to programming instructions of an algorithm 30, which may be an MP3 decoder algorithm, a WMA decoder algorithm, a MPEG algorithm, a JPEG algorithm, et cetera.

For providing data from the handheld device 10 to the host device, the SDRAM interface 88 retrieves data from the system memory and places it on the memory bus 106 under the control of the processing module 20 a it executes a file system algorithm. The USB interface 102 retrieves the data from the memory bus 106 and forwards it to the host device in accordance with one of the versions of the USB standard.

Data may also be stored in the system memory that is received via the CD (compact disk) control interface 82, and/or the I$^2$C interface 84 or other type of two or three wire data interface. Via these interfaces 82 and 84, data is received via the general purpose input/output module 80 and placed on the memory bus 106. The SDRAM interface 88 retrieves the data from the memory bus 106 and provides it to the system memory, which is done under the control of the processing module as it executes a data storage agloithm.

When the integrated circuit 12-3 is recording audio inputs received via the microphone input, the microphone bias circuit 96 provides the received audio signals to the mixing module 78 as well as to the multiplexer (mux) via a buffer. The microphone bias circuit 96 biases the audio input for optimal operations. The received audio input signals are is converted to digital audio signals via the analog-to-digital converter 68. The digital audio signals may then be stored in system memory (e.g., memory IC 16). Alternatively, the audio input signal may be provided to the summing module 78 and subsequently provided to headphone jack 94 via the programmable driver 92 as a component of a summed analog signal. The summing module 78 may sum, or pass any one of, the audio input signals may be mixed with other analog input signals, such as a line input, an FM radio input, and the analog output of the DAC 72, to produce the summed signal.

When the integrated circuit 12-3 is in a playback mode digital multimedia data is retrieved from the system memory and provided to the digital-to-analog converter 72. The digital-to-analog converter 72 converts the digital multimedia signals, which may be audio data, video data and/or text data, into analog multimedia signals and provides the analog multimedia signals to mixing module 78. In the playback mode, the mixing module 78 will generally have the other inputs muted, such that its output corresponds directly to the analog multimedia signals provided by the digital-to-analog converter 72.

The programmable driver 92 increases the drive power of the analog multimedia signals (e.g., audio signals when the analog multimedia signals are provided to a headphone) and provides it to the headphone jack 94. As one of average skill in the art will appreciate, a fixed driver may replace the programmable driver 92 to drive the headphone jack 94.

To place the integrated circuit 12-3 into the various operational modes, command are received via the general purpose input/output module 80 by the input interface 90. The input interface 90 receives the input stimulus corresponding to commands, interprets the input stimulus to generate the corresponding commands. The commands are then provided on the peripheral bus 104 and/or the memory bus 106 and processed by the processing module 20.

In addition to producing audio outputs during playback mode, the integrated circuit 12-3 may provide video outputs via the display interface 86. The display interface 86 drives the display, which may be an LCD display, LED display, plasma display and/or any other type of display. The data being displayed may correspond to the multimedia data retrieved from the system memory, and/or may correspond to the commands inputted via the input interface 90.

The system-on-a-chip (SOC) management module 100 processes interrupt controls, generates clock signals for the integrated circuit 12-3, performs bit manipulations, performs debugging operations, and executes a Reed-Solomon, or other type of encoding/decoding algorithm to encode and/or decode data.

The DC-to-DC converter 26 provides at least one supply voltage for the integrated circuit 12-3 and typically provides two supply voltages. For example, the DC-to-DC converter 26 may produce a 3.3 volts supply and a 1.8 volt supply.

Figure 5:
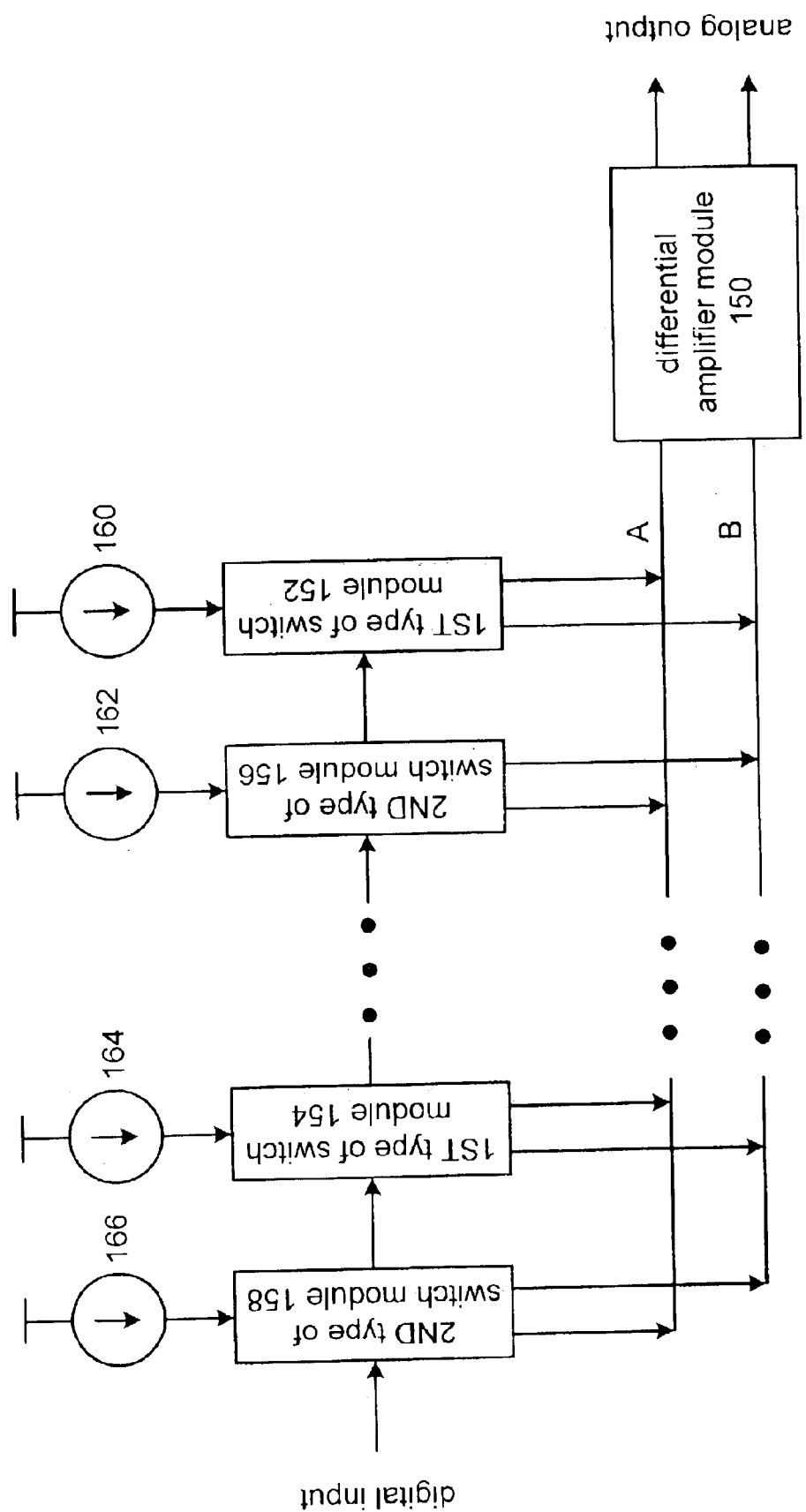
FIG. 5 is a schematic block diagram of a digital-to-analog converter in accordance with the present invention.

FIG. 5 is a schematic block diagram of the digital-to-analog converter 72. The digital-to-analog converter 72 includes a plurality of current sources 160–166 (all of equal value), a plurality of switching modules 152–158, and a differential amplifier module 150.

The switching modules 150–158 include a 1st type of switching module 152 and 154 and a 2nd type of switching module 156 and 158. The first type of switching module 152, 154 couples its corresponding current source to the differential amplifier in a first non-inverting manner (i.e., if the corresponding bit input is a logic 1, the switching module couples its corresponding current source to node A and if the bit is a logic 0, the switching module couples its corresponding current source to node B). The second type of switching module 156, 158 copies its corresponding current to the different amplifier in a second inverted manner (i.e., if the corresponding bit input is a logic 1, the switching module couples its corresponding current source to node B and if the bit is a logic 0, the switching module couples its corresponding current source to node A). The amount of current provided to the A input and B input is dependent on the current bit values of the digital input.

As shown, the digital input may be a serial bit stream where the bits of the digital input are propagated through the switching modules 152–158. For example, if the DAC includes 4 switching modules, the bits of the digital input are serially provided to switching module 152, which provides the serially received bits to the 2nd switching module 156, which provides the serially received bits to the 3rd switching module 154, which provides the serially received bits to the 4th switching module 158. In this example, a current 4-bit digital input value can be converted into one of five analog output states. The lowest of the five analog output states is achieved when the four currents bits of the digital input are all 0s (e.g., 0000, thus $b_3=b_2=b_1=b_0=0$, where $b_3$ and $b_1=0$ and $b_2$ bar and $b_0$ bar=1). With this input state, the first type of switching modules 152, 154 open the connection to node A and close the connection to node B, thus coupling its current sources to node B, which produces a first type of rise and fall time relationship. The second type of switching modules 156, 158 using the inversion of its corresponding input, opens the connection to node A and closes the connection to node B, such that its corresponding current source is coupled to node B, which produces a second type of rise and fall time relationship. The next lowest analog output state is achieved when one of the four current bits is 1 and the remaining bits are 0s (e.g., 1000, 0100, 0010, or 0001) in the same manner as described with the lowest analog output state. In a similar manner, the middle level analog output is achieved when two of the four current bits are 1s and the other two bits are 0s (e.g., 1100, 1010, 1001, 0011, 0101, 0110); the second highest state of the analog output is achieved when these of the four bits are 1s and the remaining bit is a 0 (e.g., 0111, 1110, 1011, 1101); and the highest of the five analog output states is achieved when the four current bits of the digital input are all 1s (e.g., 1111).

When the digital-to-analog converter 72 is implemented on an integrated circuit using CMOS technology, or the like, the components comprising the switching modules 152–154 and the current sources 160–166, while designed to match, do not exactly match due to temperature variations, process variations et cetera. These mismatches produces errors in the current being supplied to nodes A and B. This error causes the analog output voltage to not directly map to the desired analog voltage for the corresponding digital input (e.g., a digital input of 1100 does not exactly produce the desired middle level analog output). In accordance with an embodiment of the presence invention, by having a $1^{st}$ type of switching module that produces a positive error signal (i.e., the first type of rise and fall time relationship) and a $2^{nd}$ type of switching module that produces a negative error signal (i.e., the second type of rise and fall time relationship), the resulting error, over time, is substantially reduced. This concept will be described with greater detail with reference to FIG. 8.

Figure 6:
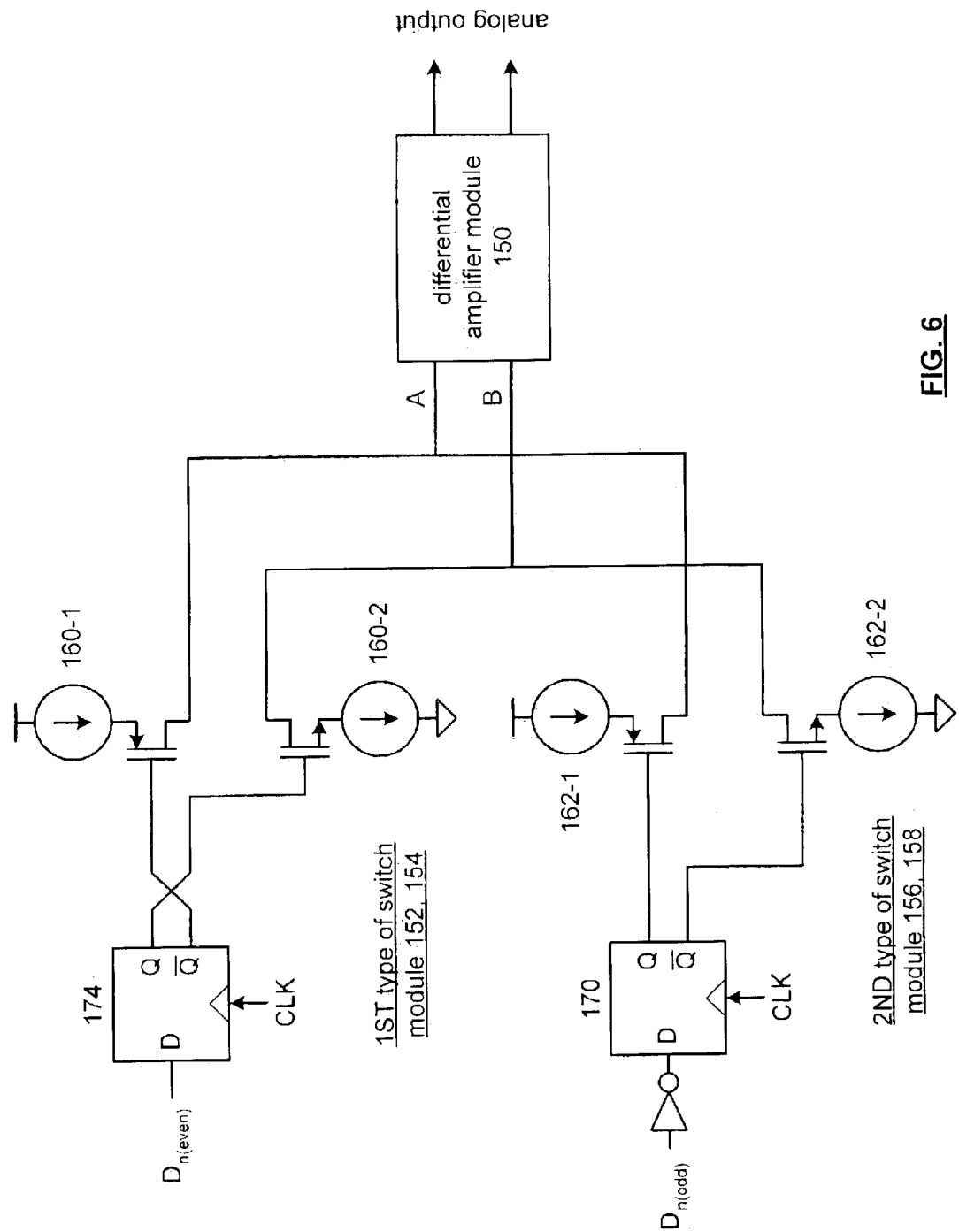
FIG. 6 is a schematic block diagram of an implementation of the $1^{st}$ and $2^{nd}$ type switching modules as shown in FIG. 5.

FIG. 6 illustrates the digital-to-analog converter 72 with an embodiment of the $1^{st}$ type of switching module 152, 154 and the $2^{nd}$ type of switching module 156, 158 shown in greater detail. As show, the $1^{st}$ type of switching module 150, 152 includes a D flip-flop 174, a P-transistor, an N-transistor and two current sources 160-1 and 160-2. The $2^{nd}$ type of switching module 156, 158 includes a D flip-flop 170, a P-channel transistor, an N-channel transistor and current sources 162-1 and 162-2.

The $1^{st}$ type of switching module 152, 154 is operably coupled to receive an even numbered bit of the digital input at the D input of flip-flop 174. The non-inverting Q output of the flip-flop 174 drives the inverter 176 and the gate of the N-transistor. Accordingly, when the digital input is a logic 1, after the rising (or falling) edge of the clock signal occurs, the non-inverting Q output is high, which enables the N-transistor. With the N and P-transistors active, current source 160-1 is sourcing current into node A and current source 160-2 is syncing current from node B. Since the switching speeds (i.e., slew rates) of the D flip-flop, and the N and P-channel transistors are not identical, an error signal will result.

In this embodiment, the $2^{nd}$ type of switching module 156–158 receives an odd numbered bit of the digital input at the D input of flip-flop 170. Accordingly, when the input of the odd bit is a logic 1, the inverting output Q, when the clock signal transitions, is low. With this signal low, the P-channel transistor is enabled as well as the N-channel transistor through inverter 172. In this configuration, the current source 162-1 is sourcing current into node A and current 162-2 is synching current from node B. By inverting the triggering of the N and P-channel transistors in the $2^{nd}$ type of switching module with respect to the $1^{st}$ type of switch module, the error produced is complementary to the error produced by the first type of switching module. For example, if the $1^{st}$ type of switching module produces a positive error signal, the $2^{nd}$ type of switching module produces a corresponding negative error signal. As such, over time, the positive error signal is substantially cancelled by the negative error signal thus substantially reducing the net error caused by mismatching of the components of the digital-to-analog converter. As one of average skill in the art appreciate, a large impedance may be included between node A and B such that when all of the digital inputs are 0, the inputs at node A and B are zero to produce a zero analog output.

Figure 7:
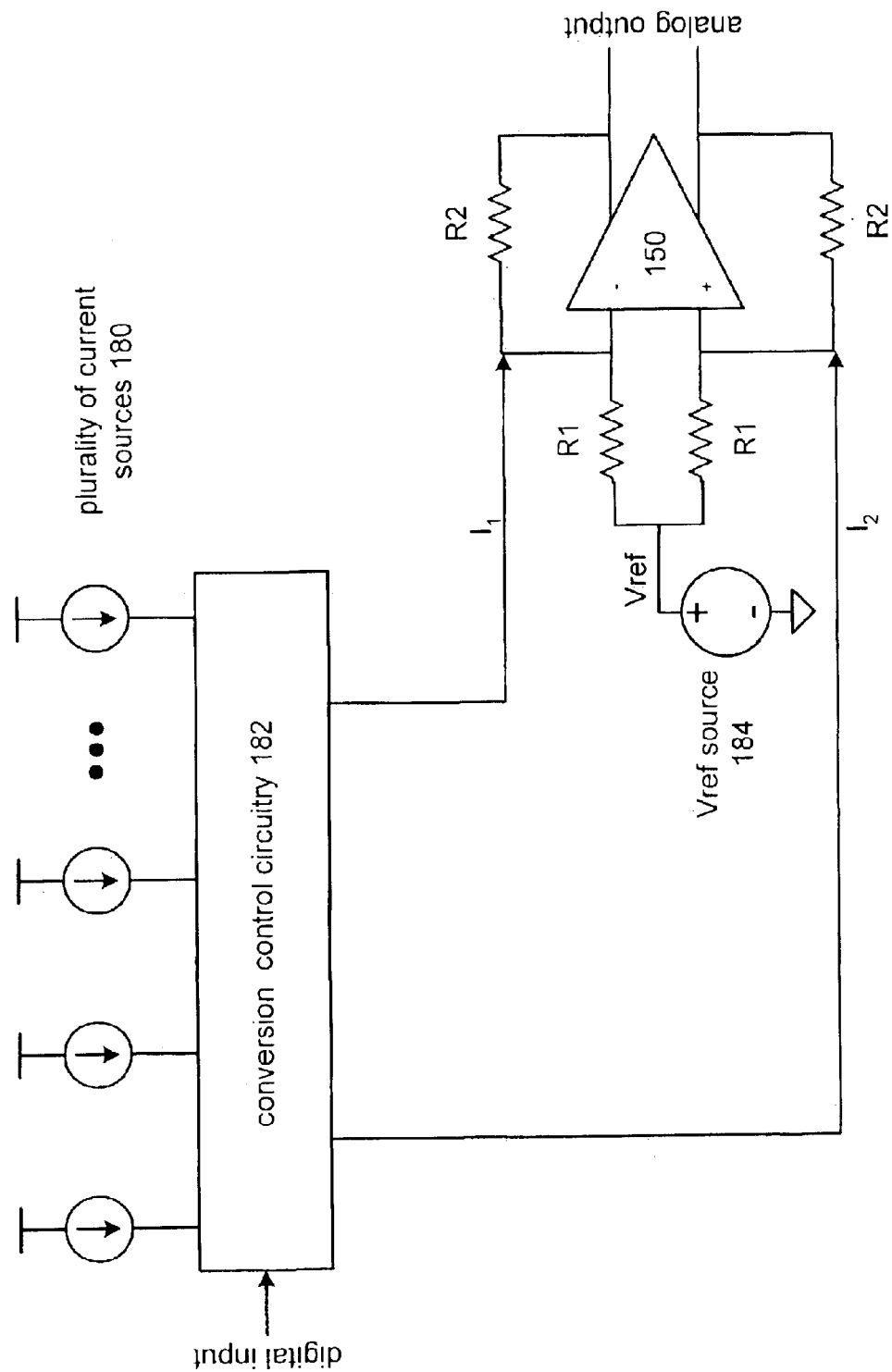
FIG. 7 is a schematic block diagram of another embodiment of a digital-to-analog converter in accordance with the present invention.

FIG. 7 is a schematic block diagram of a digital-to-analog converter 72 that includes a plurality of current sources 180, conversion control circuitry 182, the differential amplifier modules 150, and a voltage reference source 184. The differential amplifier module 150, which produces the analog output, includes a differential amplifier and feedback circuit, which is shown as a resistive gain network including resistors R1 and R2, wherein the gain of the differential amplifier module 150 is based on the ratio of resistors R1 and R2. The input resistors R1 are operably coupled to receive a reference voltage from the voltage reference source 184. As one of average skill in the art will appreciate, the feedback circuitry corresponding to the gain of the operational amplifier 150 may include additional resistors, capacitors, et cetera to establish a desired frequency response.

In operation, based on the digital input value, the conversion control circuit 182 couples corresponding ones of the plurality of current sources 180 to produce a first current ($I_1$) and/or a second current ($I_2$). The coupling of the current sources to produce the first current ($I_1$) and the second current ($I_{N2}$) is done such that imbalances between the rise and fall times of the switching of the current source between contributing to the first current and the second current substantially cancels over time thus producing an accurate digital-to-analog conversion. Note that the number of current sources corresponds to the desired granularity, or resolution, of the analog output, which may range from $4-2^N$, where N is any integer greater than 2.

The difference between the first and second currents, establishes the analog output voltage. For example, when the current digital input is in a state where all of the current sources are coupled to produce the first current, which is injected in the inverting node of the differential amplifier, the non-inverting output of the different amplifier decreases to its lowest value, while the inverting output of the differential amplifier is at its highest value. Thus, from the non-inverting output to the inverting output, the analog output is at its most negative value. Conversely, when the digital input is in a state where all of the current sources are coupled to produce the second current, which is injected into the non-inverting input of the differential amplifier, the inverting output of the differential amplifier decreases to its lowest value, while the non-inverting output of the differential amplifier is at its highest value. Thus, from the non-inverting output to the inverting output, the analog output is at its most positive value. As one of average skill in the art will appreciate, the polarity of the differential amplifier may reversed and the desired digital to analog conversion will still be achieved.

Figure 8:
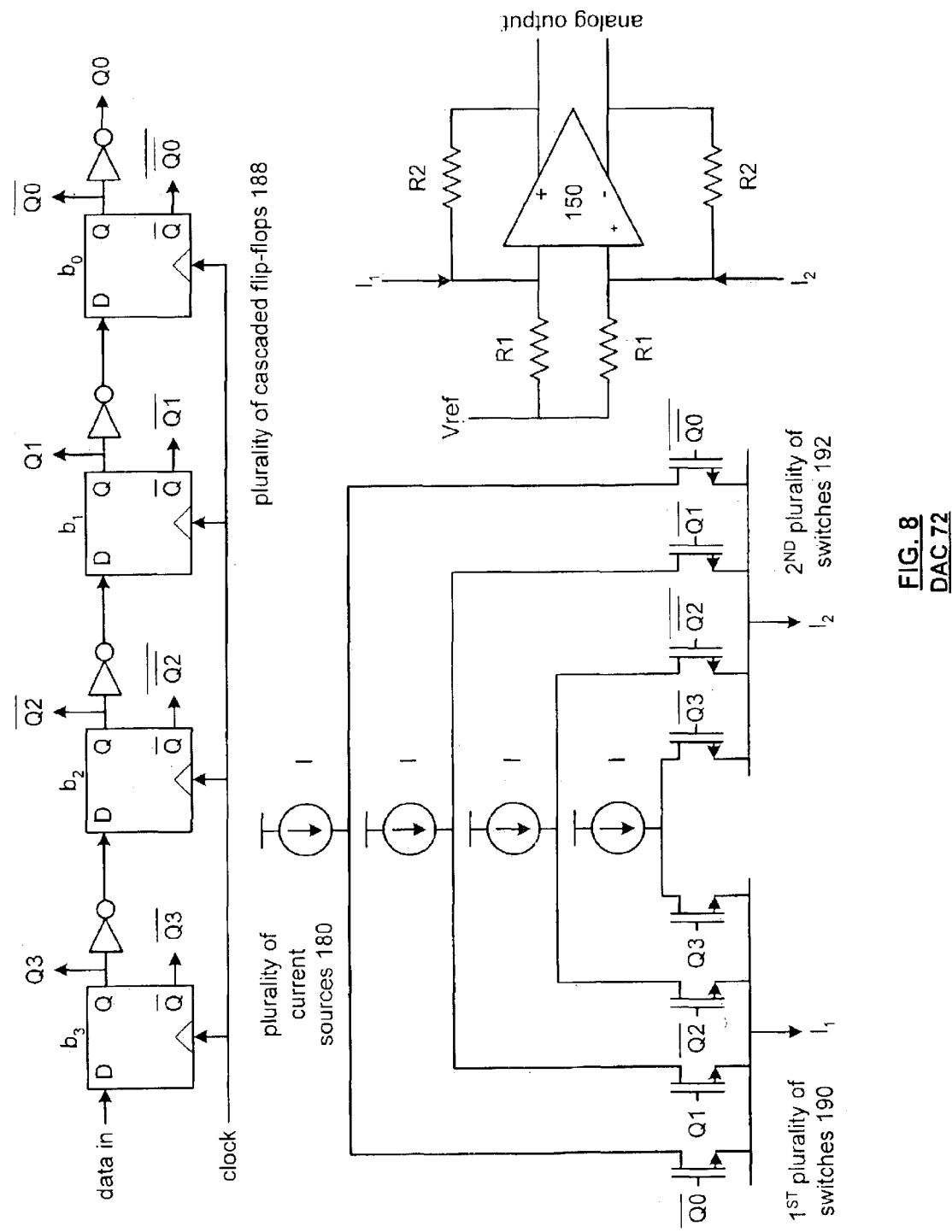
FIG. 8 is a schematic block diagram of another embodiment of a digital-to-analog converter in accordance with the present invention.

FIG. 8 is a more detailed schematic block diagram of one embodiment of the digital-to-analog converter of FIG. 7. In this embodiment, the conversion control circuitry 182 includes a plurality of cascaded flip-flops 188 with intervening inverters and a plurality of transistors coupled to the plurality of current sources 180. In this illustration, the digital-to-analog converter includes only four current sources for each of illustration. However, in application, the number of current sources may range from $4-2^N$.

For the DAC of FIG. 8, Table 1 illustrates the ideal current production for the various possible digital inputs. Note that with four current sources, the resolution of the analog output is five, as will become evident with reference to Tables 1 and 2. The bits of the digital input enable the transistors producing the resulting first current ($I_1$) and the second current ($I_2$) and the resulting total current ($I_1-I_2$). Thus, when the digital input is 0000, all the transistors are producing $I_2$ and none are producing $I_1$ such that the total current $-4I$. When the current $-4I$ is converted into a voltage by the differential amplifier 150 it will the minimum analog output. As can be seen from the ideal current production table 1, as the digital input values change, the differing transistors are enabled producing the corresponding first currents $I_1$ and second currents $I_2$ and the resulting total current $I_1-I_2$. If the digital-to-analog converter of FIG. 8 were implemented based on the ideal current productions of the table 1, the current imbalances as described in the background section will result thereby producing inaccuracies within the digital-to-analog conversion process. To overcome these inaccuracies, every other current source has at least one inversion to produce the first current $I_1$ and/or the second current $I_2$.

TABLE 1

Ideal current production for a 4-bit DAC

| data input bits | | | | currents | | |
|---|---|---|---|---|---|---|
| Q3 | Q2 | Q1 | Q0 | $I_1$ | $I_2$ | ($I_1-I_2$) |
| 0 | 0 | 0 | 0 | 0 | 4I | −4I |
| 0 | 0 | 0 | 1 | I | 3I | −2I |
| 0 | 0 | 1 | 0 | I | 3I | −2I |
| 0 | 1 | 0 | 0 | I | 3I | −2I |
| 1 | 0 | 0 | 0 | I | 3I | −2I |
| 0 | 0 | 1 | 1 | 2I | 2I | 0 |
| 0 | 1 | 1 | 0 | 2I | 2I | 0 |
| 1 | 1 | 0 | 0 | 2I | 2I | 0 |
| 1 | 0 | 0 | 1 | 2I | 2I | 0 |
| 1 | 0 | 1 | 0 | 2I | 2I | 0 |

TABLE 1-continued

Ideal current production for a 4-bit DAC

| data input bits | | | | currents | | |
|---|---|---|---|---|---|---|
| Q3 | Q2 | Q1 | Q0 | $I_1$ | $I_2$ | ($I_1-I_2$) |
| 0 | 1 | 0 | 1 | 2I | 2I | 0 |
| 1 | 1 | 1 | 0 | 3I | I | 2I |
| 1 | 1 | 0 | 1 | 3I | I | 2I |
| 1 | 0 | 1 | 1 | 3I | I | 2I |
| 0 | 1 | 1 | 1 | 3I | I | 2I |
| 1 | 1 | 1 | 1 | 4I | 0 | 4I |

With reference to the plurality of cascaded flip-flops 188, the 1$^{st}$ flip-flop receives the digital input (data in) in a serial manner and passes the bits to the remaining flip-flops. As such, after four bits of the digital input are received, the 1$^{st}$ flip-flop contains the fourth inputted bit (for this example $b_3$). The 2$^{nd}$ flip-flop is coupled to the output of the 1$^{st}$ flip-flop via an inverter and contains the third inputted bit (for this example bit $b_2$). The 3$^{rd}$ and 4$^{th}$ flip-flops are similarly coupled to the preceding flip-flop via an inverter and contain, respectively, the second inputted bit (for this example bit $b_1$) and the first inputted bit (for this example $b_0$). In this illustration, the 1$^{st}$ flip-flop via its Q and Q bar outputs produce the drive signals for the transistors coupled to one of the plurality of current sources. Thus, if the digital input for bit $b_3$ is 1, Q3 is high and Q3 bar is low such that the current (I) of this corresponding current source is provided to the inverting node of the differential amplifier as part of the first current ($I_1$). The next flip-flop receives the inversion of the non-inverting output of the 1$^{st}$ flip-flop. Thus, the non-inverting output of the 2$^{nd}$ flip-flop represents at the inversion of the input and Q bar represents the double inversion of the input. Based on these signals, the next current source is enabled to contribute to the first current $I_1$ or the second current $I_2$.

The 3$^{rd}$ flip-flop is coupled to receive the non-inverting output of the 2$^{nd}$ flip-flop through an inverter. Thus, a double inversion of the data has occurred such that the non-inverted output of the 3$^{rd}$ flip-flop corresponds to the non-inverted $b_1$ and the Q bar output of the 3$^{rd}$ flip-flop corresponds to the inversion of bit $b_1$. Based on Q1 and Q1 bar, the next current source (I) is either provided to contribute to the first current $I_1$ or the second current $I_2$. The 4$^{th}$ flip-flop receives the non-inverting output, via an inverter, of the 3$^{rd}$ flip-flop. Thus, the non-inverting output of the 4$^{th}$ flip-flop represents the inversion of the corresponding bit $B_0$ input and the Q bar output of the 4$^{th}$ flip-flop represents the double inversion of the corresponding bit $B_0$ input. Q0 bar and Q0 double bar switch the last current source to contribute to either the first current ($I_1$) or the second current ($I_2$). As shown, as 1$^{st}$ plurality of transistors 190 couple the current sources to produce the first current ($I_1$) and a second plurality of switches 192 couple the current sources to produce the second current ($I_2$).

Table 2 illustrates how the transistors are enabled in the 4-bit DAC of FIG. 8 to produce the corresponding first current $I_1$, the corresponding second current $I_2$ and the resulting effective total current $I_1-I_2$. Thus, when the digital input stream is 0000, the resulting Q3, Q2 bar, Q1 and Q0 bar has a digital value of 0101 producing the current as indicated in the table. For a digital input stream of 0001, the corresponding Q3, Q2 bar, Q1 and Q0 bar outputs is 0100 as indicated in table 2 producing the corresponding positive current, negative current and current difference. For each of the remaining possible combinations of the digital input, table 2 illustrates the corresponding production of the first current, the second current and the current difference.

TABLE 2 current production for a 4-bit DAC of FIG. 8

| data input bits | | | | currents | | |
|---|---|---|---|---|---|---|
| Q3 | Q2-bar | Q1 | Q0-bar | $I_1$ | $I_2$ | $(I_1-I_2)$ |
| 0 | 1 | 0 | 1 | 0 | 4I | −4I |
| 0 | 1 | 0 | 0 | I | 3I | −2I |
| 0 | 1 | 1 | 1 | I | 3I | −2I |
| 0 | 0 | 0 | 1 | I | 3I | −2I |
| 1 | 1 | 0 | 1 | I | 3I | −2I |
| 0 | 1 | 1 | 0 | 2I | 2I | 0 |
| 0 | 0 | 1 | 1 | 2I | 2I | 0 |
| 1 | 0 | 0 | 1 | 2I | 2I | 0 |
| 1 | 1 | 0 | 0 | 2I | 2I | 0 |
| 1 | 1 | 1 | 1 | 2I | 2I | 0 |
| 0 | 0 | 0 | 0 | 2I | 2I | 0 |
| 1 | 0 | 1 | 1 | 3I | I | 2I |
| 1 | 0 | 0 | 0 | 3I | I | 2I |
| 1 | 1 | 1 | 0 | 3I | I | 2I |
| 0 | 0 | 1 | 0 | 3I | I | 2I |
| 1 | 0 | 1 | 0 | 4I | 0 | 4I |

By comparing the resulting currents of table 1 and table 2, it is readily apparent that the resulting net effect currents are identical. However, by including the inversion and double inversions within the plurality of cascaded flip-flops, the triggering of rise and fall times of the matched transistors of the $1^{st}$ plurality of switches 190 and the $2^{nd}$ plurality of switches 192 are complementary such that the differences in rise and fall times of the drive circuitry of the corresponding flip-flops or similar type drive circuitry, is substantially cancelled over time, thereby enabling an accurate digital-to-analog conversion of high bit count and high data rate digital-to-analog converters. As one of average skill in the art will appreciate, the output of the intervening inverters may be used as the outputs to drive the transistors, such that, for Table 2, bits $b_3$ and $b_1$ are inverted and bits $b_2$ and $b_0$ are not inverted.

Figure 9:
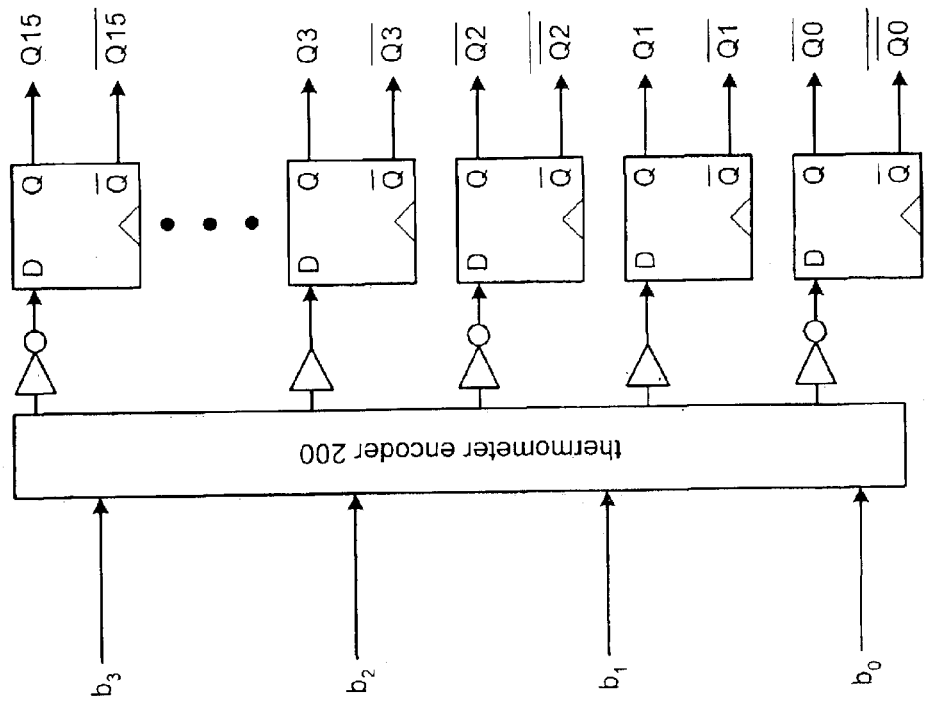
FIG. 9 is a schematic block diagram of an embodiment of the conversion control circuitry of the digital-to-analog converter of FIG. 7.

FIG. 9 is a schematic block diagram of an alternate embodiment of a portion of the conversion control circuit 182. As an alternative to the plurality of cascaded flip-flops 188, the conversion control circuitry 182 may include a thermometer 200, buffers, and inverters, wherein the thermometer encoder encodes the digital inputs to produce an encoded digital signal. As is known, a thermometer encoder encodes a binary digital value into a 1's density digital value. Thus, as shown, a four bit digital input, which has sixteen states, is converted into a 16-bit 1's density digital signal. Each bit of the thermometer encoder output is either buffered or inverted before being inputted to a corresponding flip-flop. Thus, in this embodiment, the DAC may receive the digital input in a parallel and produce a corresponding analog output.

Figure 10:
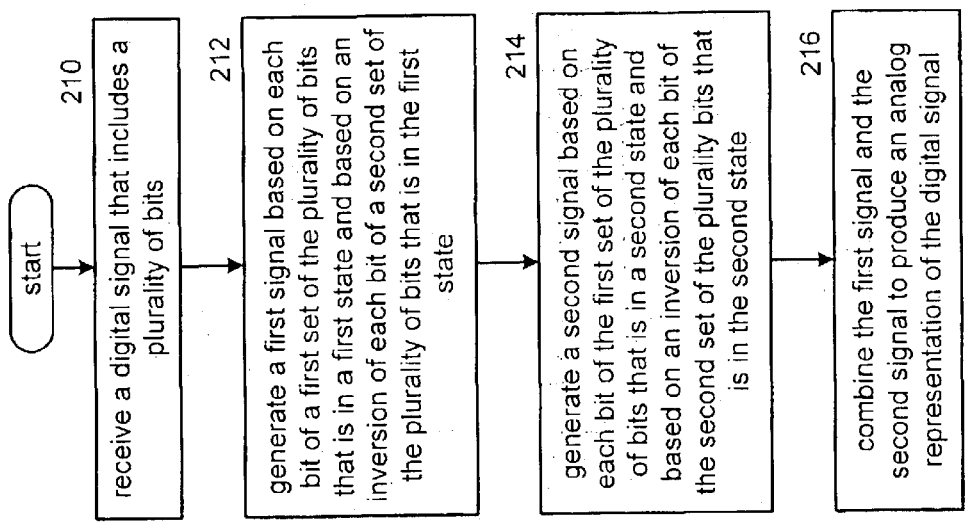
FIG. 10 is a logic diagram of a method for accurate digital-to-analog conversion in accordance with the present invention.

FIG. 10 is a logic diagram of a method for accurate digital-to-analog conversion, which may be performed by the digital-to-analog converter with support by processing module 20. The process begins at Step 210 where a digital signal that includes a plurality of bits is received. The process then proceeds to Step 212 where a first signal is generated based on each bit of a $1^{st}$ set of the plurality of bits that is in a $1^{st}$ state and based on an inversion of each bit of a $2^{nd}$ set of bits that is in the $1^{st}$ state. As an example, refer to FIG. 7 for the production of the first current $I_1$.

The process then proceeds to Step 214 where a second signal is generated based on each bit of the $1^{st}$ set of the plurality of bits that is in a $2^{nd}$ state and based on an inversion of each bit of the $2^{nd}$ set of bits that is in the $2^{nd}$ state. For an example, refer to the generation of the second current via the $2^{nd}$ plurality of switches 192 as shown in FIG. 7. The process then proceeds to Step 216 where the first signal and second signal are combined to produce an analog representation of the digital signal. Note that if the digital input includes N bits, every 2×N bits of the plurality of bits may be indicated in the $1^{st}$ set and every 2×N-1 bits may be in the $2^{nd}$ set of bits. Thus, as shown in FIG. 4, if N=4, two of the bits $B_3$ and $B_1$ would be in the $1^{st}$ set and bits $B_0$ and $B_2$ would be in the $2^{nd}$ set.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of the average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

The preceding discussion has presented a method and apparatus for accurate digital-to-analog conversion. By varying the generation of a first and second current for analog-to-digital conversion such that the imbalances in rise and fall times offset each other, an accurate digital-to-analog conversion process is obtained without the need for a return to zero circuit, thus power consumption is reduced and high-speed data may be processed. As one of average skill in the art will appreciate, other embodiments may be derived from the teachings of the present invention without deviating from the scope of the claims:

What is claimed is:

1. A digital to analog converter comprises:
    differential amplifier having a non-inverting input, an inverting input, an non-inverting output, an inverting output, and a gain network coupled to the non-inverting input, the inverting input, the non-inverting output, and the inverting output, wherein the inverting and non-inverting outputs provide an analog output of the digital to analog converter;
    plurality of current sources; and
    conversion control circuitry operably couples a first set of the plurality of current sources to the inverting input or the non-inverting input of the differential amplifier in accordance with a first set of bits of a digital input and couples, via at least one inversion, a second set of the plurality of current sources to the inverting or the non-inverting input of differential amplifier based on a second set of bits of the digital input.

2. The digital to analog converter of claim 1, wherein the gain network of the differential amplifier further comprises:
   a voltage reference source that provides a voltage reference;
   a first resistor coupled to the voltage reference source and the inverting input;
   a second resistor coupled to the voltage reference source and the non-inverting input, wherein the first and second resistors have substantially similar resistance values;
   a third resistor coupled to the non-inverting input and the inverting output; and
   a fourth resistor coupled to the inverting input and the non-inverting output, wherein the third and fourth resistors have substantially similar resistance values.

3. The digital to analog converter of claim 1, wherein the plurality of current sources further comprises N number of current sources, wherein each of the N number of current sources provides a same current value, wherein N corresponds to resolution of the analog output.

4. The digital to analog converter of claim 1, wherein the conversion control circuitry further comprises:
   a first plurality of switches connected to the plurality of current sources and to the inverting input of the differential amplifier, wherein a number of switches in the first plurality of switches corresponds to resolution of the analog output and wherein a number of current sources in the plurality of current sources corresponds to the resolution of the analog output;
   a second plurality of switched connected to the plurality of current sources and to the non-inverting input of the differential amplifier, wherein a number of switches in the second plurality of current sources corresponds to the resolution of the analog output; and
   a plurality of cascaded flip-flops interconnected via a plurality of inverters, wherein a number of flip-flops in the plurality of cascaded flip-flops corresponds to the resolution of the analog output, wherein every 2*N flip-flop of the plurality of cascaded flip-flops provides the first set of bits of the digital input, wherein every 2*N-1 flip-flop of the plurality of cascaded flip-flops provides, via the at least one inversion, the second set of bits of the digital input, wherein N corresponds to the resolution of the analog output.

5. The digital to analog converter of claim 1, wherein the conversion control circuitry further comprises:
   a thermometer encoder operably coupled to in parallel, receive the first and second set of bits of the digital input and to convert the digital input into an encoded digital input;
   a plurality of flip-flops each operably coupled to receive a corresponding bit of the encoded digital input, wherein each of the plurality of flip-flops produce an output and an inverted output;
   a first plurality of switches, wherein each of the first plurality of switches is operable to connect a corresponding one of the plurality of current sources to the inverting input of the differential amplifier when the output of the corresponding one of the plurality of flip-flops is a logic 1; and
   a second plurality of switched, wherein each of the second plurality of switches is operable to connect the corresponding one of the plurality of current sources to the non-inverting input of the differential amplifier when the inverted output of the corresponding one of the plurality of flip-flops is a logic 1.

6. A digital to analog converter comprises:
   a plurality of current sources;
   differential amplifier module that provides an analog output; and
   a plurality of switching modules, wherein each of the plurality of switching modules is operably coupled to a corresponding current source of the plurality of current sources, wherein a first set of the plurality of switching modules couples the corresponding current sources to the differential amplifier module in a first manner based on a digital input value and a second set of the plurality of switching modules couples the corresponding current sources to the differential amplifier modules in a second manner based on the digital input value such that, over-time, errors introduced by the coupling in the first manner substantially compensate for errors introduced by the coupling in the second manner.

7. The digital to analog converter to claim 6, wherein a switching module of the first set of the plurality of switching modules further comprises:
   a flip-flop operably coupled to receive a bit of the digital input value and, when clocked, produce an output corresponding to the bit;
   first switch operable to couple the corresponding current source to a first input of the differential amplifier module when the output of the flip-flop is in a first state; and
   second switch operable to coupled the corresponding current source to a second input of the differential amplifier module when the output of the flip-flop in a second state.

8. The digital to analog converter of claim 7, wherein a switching module of the second set of the plurality of switching modules further comprises:
   a flip-flop module operably coupled to receive a bit of the digital input value and, when clocked, produce a complimentary output corresponding to the bit;
   first switch operable to couple the corresponding current source to the second input of the differential amplifier module when the complimentary output of the flip-flop is in the first state; and
   second switch operable to coupled the corresponding current source to the first input of the differential amplifier module when the complimentary output of the flip-flop is in the second state.

9. The digital to analog converter of claim 6 further comprises:
   a thermometer encoder operably coupled to receive, in parallel, the digital input value, wherein the thermometer encoder encodes the digital input value into an encoded digital value, wherein the thermometer encoder provides the encoded digital value to the plurality of switches as the digital input value.

10. The digital to analog converter of claim 6, wherein the differential amplifier further comprises:
    a non-inverting input, an inverting input, an non-inverting output, an inverting output, and a gain network coupled to the non-inverting input, the inverting input, the non-inverting output, and the inverting output.

11. The digital to analog converter of claim 10, wherein the gain network of the differential amplifier further comprises:
   a voltage reference source that provides voltage reference;
   a first resistor coupled to the voltage reference source and the inverting input;
   a second resistor coupled to the voltage reference source and the non-inverting input, wherein the first and second resistors have substantially similar resistance values;
   a third resistor coupled to the non-inverting input and the inverting output; and
   a fourth resistor coupled to the inverting input and non-inverting output, wherein the third and fourth resistors have substantially similar resistance values.

12. The digital to analog converter of claim 6, wherein the plurality of current sources further comprises N number of current sources, wherein each of the N number of current sources provides a same current value, wherein N corresponds to resolution of the analog output.

13. A method for digital to analog conversion, the method comprises:
   receiving a digital signal that includes plurality of bits;
   generating a first signal based on each bit of a first set of the plurality of bits that is in a first state and based on an inversion of each bit of a second set of the plurality of bits that is in the first state;
   generating a second signal based on each bit of the first set of the plurality of bits that is in a second state and based on an inversion of each bit of the second set of the plurality bits that is in the second state; and
   combining the first and second signals to produce an analog representation of the digital signal.

14. The method of claim 13 further comprises:
   generating the first signal as a first current signal;
   generating the second signal as a second current signal;
   combining the first current signal and the second current signal to produce a current; and
   converting the current signal into an analog voltage.

15. The method of claim 13 further comprises:
   selecting every 2*N bits of the plurality of bits to comprise the first set of the plurality of bits; and selecting every 2*N-1 bits of the plurality of bits to comprise the second set of the plurality of bits.

16. An apparatus for digital to analog conversion, the apparatus comprises:
   processing module; and
   memory operably coupled to the processing module, wherein the memory further comprises operational instructions that cause the processing module to:
      receive a digital signal that includes a plurality of bits;
      generate a first signal based on each bit of a first set of the plurality of bits that is in a first state and based on an inversion of each bit of a second set of the plurality of bits that is in the first state;
      generate a second signal based on each bit of the first set of the plurality of bits that is in a second state and based on an inversion of each bit of the second set of the plurality bits that is in the second state; and
      combine the first signal and the second signal to produce an analog representation of the digital signal.

17. The apparatus of claim 16, wherein the memory further comprises operational instructions that cause the processing module to:
   generate the first signal as a first current signal;
   generate the second signal as a second current signal;
   combine the first current signal and the second current signal to produce a current; and
   convert the current signal into an analog voltage.

18. The apparatus of claim 16, wherein the memory further comprises operational instructions that cause the processing module to:
   select every 2*N bits of the plurality of bits to comprise the first set of the plurality of bits; and
   select every 2*N-1 bits of the plurality of bits to comprise the second set of the plurality of bits.

* * * * *